US011173447B2

United States Patent
Spaulding et al.

(10) Patent No.: US 11,173,447 B2
(45) Date of Patent: Nov. 16, 2021

(54) PORTABLE DEHUMIDIFYING CHAMBER (71) Applicant: INTERNATIONAL BUSINESS MACHINES CORPORATION, Armonk, NY (US)

(72) Inventors: Sharon T Spaulding, Highland, NY (US); Karl Owen Casserly, Valley Stream, NY (US); Mateusz Koziol, Poughkeepsie, NY (US); Paul Samaniego, Port Ewen, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 16/533,852

(22) Filed: Aug. 7, 2019

(65) Prior Publication Data
US 2021/0039041 A1 Feb. 11, 2021

(51) Int. Cl.
*B01D 53/26* (2006.01)
*B01D 53/04* (2006.01)
*H05K 7/14* (2006.01)

(52) U.S. Cl.
CPC ....... *B01D 53/261* (2013.01); *B01D 53/0438* (2013.01); *B01D 53/0446* (2013.01);
(Continued)

(58) Field of Classification Search
CPC ............... B01D 53/04; B01D 53/0407; B01D 53/0438; B01D 53/0446; B01D 53/0454;
(Continued)

(56) References Cited

U.S. PATENT DOCUMENTS 1,749,763 A * 3/1930 Fleisher ............... F24F 3/14
62/92
4,540,420 A * 9/1985 Wharton ............ B01D 53/261
96/123

(Continued)

FOREIGN PATENT DOCUMENTS

CA 30075881 A 8/2018
CN 108072187 A 5/2018
(Continued)

OTHER PUBLICATIONS

Salarian et al., "An experimental and modeling study of a dehumidification tower", Jul. 2011 Academic Journals, pp. 1-10.

*Primary Examiner* — Frank M Lawrence, Jr.
(74) *Attorney, Agent, or Firm* — Tihon Poltavets (57) ABSTRACT

A portable dehumidifying chamber includes a frame of a structure configured to include a first zone, a second zone, and a third zone, where a plurality of exterior walls coupled to the frame of the structure isolate the first zone, the second zone, and third zone from surrounding environmental conditions. A heating device disposed in the first zone to facilitate heated air flow from the first zone to the third zone, where the heated air flow contacts an object disposed in the second zone to facilitate dehumidification of the object. A conduit connecting the third zone to the first zone, where the conduit allows for humidified air flow to bypass the second zone, where the conduit includes a moisture removing apparatus. A first vapor barrier material separates the first zone and the second zone and a second vapor barrier material separates the second zone and the third zone.

17 Claims, 8 Drawing Sheets

(52) U.S. Cl.
CPC .... B01D 53/0454 (2013.01); *B01D 2253/106* (2013.01); *B01D 2253/3425* (2013.01); *B01D 2257/80* (2013.01); *H05K 7/1497* (2013.01)

(58) Field of Classification Search
CPC ............ B01D 53/261; B01D 2253/106; B01D 2253/3425; B01D 2257/80; B01D 2259/4508; H05K 5/0213; H05K 7/1488; H05K 7/1497; F24F 3/14; F24F 3/1411; F24F 3/1423; F24F 3/144
USPC .................................. 96/109, 111, 112, 148
See application file for complete search history.

(56) References Cited

U.S. PATENT DOCUMENTS

| | | | |
|---|---|---|---|
| 5,395,285 A * | 3/1995 | Milton | ............... F24F 3/14 454/52 |
| 5,478,379 A * | 12/1995 | Bevins | ............... B01D 46/0031 55/356 |
| 5,884,486 A | 3/1999 | Hughes | |
| 9,089,814 B2 | 7/2015 | Pendergrass | |
| 10,098,265 B2 | 10/2018 | Towner | |
| 2012/0165991 A1 | 6/2012 | Tian | |
| 2014/0338883 A1* | 11/2014 | Watanabe | ............ B01D 53/265 165/287 |
| 2014/0340842 A1* | 11/2014 | Towner | ............... H05K 7/20827 361/679.48 |
| 2014/0349563 A1* | 11/2014 | Honda | ............... H05K 7/20709 454/184 |
| 2018/0372357 A1 | 12/2018 | Demonte | |

FOREIGN PATENT DOCUMENTS

| | | |
|---|---|---|
| KR | 101320271 B1 | 10/2013 |
| KR | 20170053838 A | 5/2017 |

* cited by examiner

PORTABLE DEHUMIDIFYING CHAMBER

FIELD OF THE INVENTION

This disclosure relates generally to dehumidifying chambers, and in particular, to a portable dehumidifying chamber for acclimating sensitive electronic equipment.

BACKGROUND OF THE INVENTION

Sever and storage equipment (e.g., racks and frames) are typically gradually acclimated to a surrounding environment to prevent condensation and increased levels of humidity associated with condensation. When the server and storage equipment is shipped in a climate where the outside temperature is below the dew point of a customer site (i.e., indoor location), there is a possibility that water condensation can form on the cooler inside and outside surfaces of the equipment when the equipment is brought into the customer site for installation. Sufficient time is typically required for the sever and storage equipment to gradually reach thermal equilibrium with the environment at the customer site.

SUMMARY

One aspect of an embodiment of the present invention discloses an apparatus for a portable dehumidifying chamber comprising a frame of a structure configured to include a first zone, a second zone, and a third zone, wherein a plurality of exterior walls coupled to the frame of the structure isolate the first zone, the second zone, and third zone from surrounding environmental conditions. The portable dehumidifying chamber further comprising a heating device disposed in the first zone to facilitate heated air flow from the first zone to the third zone, wherein the heated air flow contacts an object disposed in the second zone to facilitate dehumidification of the object. The portable dehumidifying chamber further comprising a conduit connecting the third zone to the first zone, wherein the conduit allows for humidified air flow to bypass the second zone, wherein the conduit includes a moisture removing apparatus. The portable dehumidifying chamber further comprising a first vapor barrier material separates the first zone and the second zone. The portable dehumidifying chamber further comprising a second vapor barrier material separates the second zone and the third zone.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments of the present invention provide a portable dehumidifying chamber for dehumidifying an object disposed within the portable dehumidifying chamber. The portable dehumidifying chamber utilizes a collapsible frame with three defined zones including a heated zone, central zone with the object requiring dehumidification, and a dehumidifying zone. The collapsible frame of portable dehumidifying chamber allows for rapid deployment at a customer site and utilizes various connectors constructed around the object. Vapor barrier material is utilized to establish the three defined zones of portable dehumidifying chamber. A first plenum between the heated zone and the central zone and a second plenum between the central zone and the dehumidifying zone act as insulators to create the three defined zones. A duct or conduit connects the dehumidifying zone and the heated zone, where one or more desiccant discs disposed in the duct or conduit absorb moisture from air flowing from the dehumidifying zone to the heated zone. One or more temperature sensors are utilized to monitor and control a temperature of a heater disposed in the heated zone to overheating sensitive equipment or materials requiring dehumidification in portable dehumidifying chamber. One or more humidity sensors are utilized to measure relative humidity within the chamber to stop the dehumidification process once a target humidity level is reached.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure or first member, is present on a second element, such as a second structure or second member, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 1A:
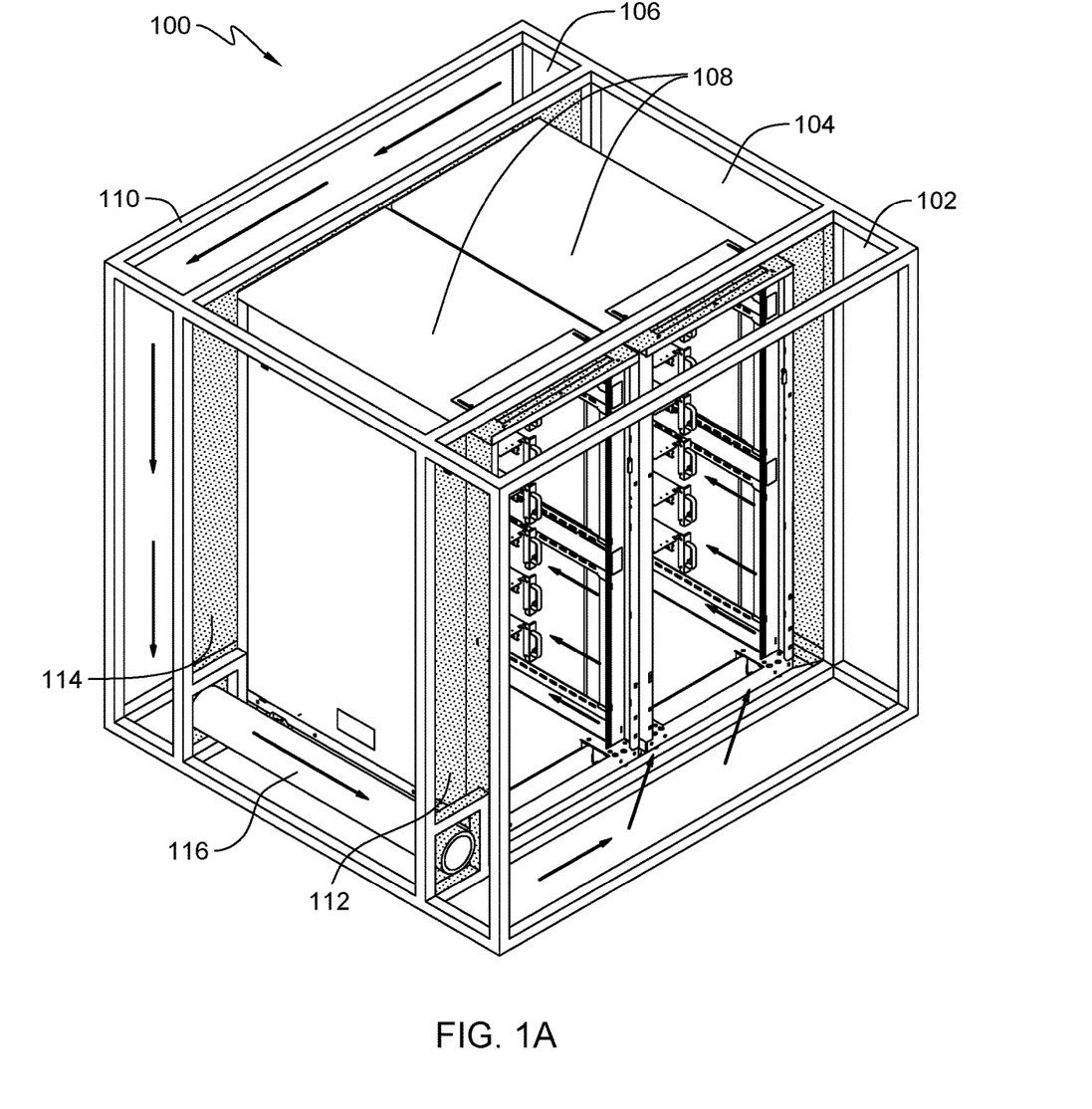
FIG. 1A depicts a 3-dimensional view of a portable dehumidifying chamber and server rack, in accordance with an embodiment of the present invention.

FIG. 1A depicts a 3-dimensional view of a portable dehumidifying chamber and server rack, in accordance with an embodiment of the present invention. In this embodiment, portable dehumidifying chamber 100 includes zone 102, 104, and 106, where server rack 108 is disposed within portable dehumidifying chamber 100. Portable dehumidifying chamber 100 is a sealed structure supported by frame 110, where frame 110 includes four exterior side walls and a top exterior wall. In this embodiment, frame 110 does not include a lower exterior wall due to a floor surface on which server rack 108 is disposed provides an appropriate seal for portable dehumidifying chamber 100. In another embodiment, frame 110 utilizes a lower exterior wall across an entire lower surface of portable dehumidifying chamber 100. In yet another embodiment, frame 110 utilizes one or more lower exterior walls across a lower surface of portable dehumidifying chamber 100, where the one or more lower exterior walls are positioned in zone 102 and/or zone 106.

Frame 110 of portable dehumidifying chamber 100 provides the structural support for zone 102, 104, and 106, where frame 110 can be assembled and disassembled for relocation between multiple sites. Zone 102 and zone 104 is separated by vapor barrier 112 and zone 104 and zone 106 is separated by vapor barrier 114. Vapor barrier 112 and 114 are each coupled along a perimeter of an enclosure for server rack 102 and a perimeter of an interior surface of the exterior walls of portable dehumidifying chamber 100, such that the only passageway between zone 102, 104, and 106 is through an interior area of sever rack 108 or through conduit 116.

An air recirculation and dehumidification process initializes with a heater (discussed in further detail with regards to FIG. 3A-3C) disposed in zone 102 that produces warm air flow through zone 104 into the interior area of server rack 108, which includes the various processors and electronic equipment installed on server rack 108 requiring dehumidification. As humidified air exits zone 104 into zone 106, the humidified air is pulled into conduit 116, where moisture is removed from the humidified air utilizing one or more moisture removing techniques discussed in further detail with regards to FIG. 4A-4D and FIG. 5A-5C. Once the moisture is removed from the previously humidified air in conduit 116, recycled dehumidified air exits conduit 116 and enters zone 102 completing the air recirculation and dehumidification process.

Figure 1B:
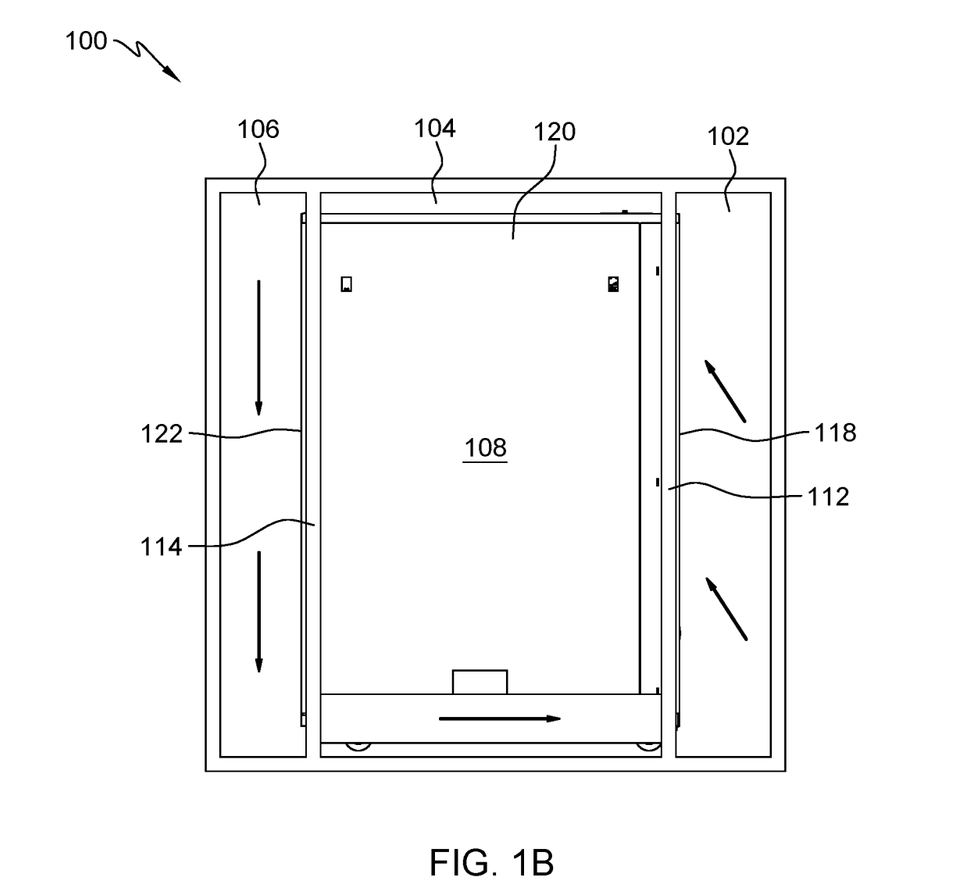
FIG. 1B depicts a side view of a portable dehumidifying chamber and server rack, in accordance with an embodiment of the present invention.

FIG. 1B depicts a side view of a portable dehumidifying chamber and server rack, in accordance with an embodiment of the present invention. In this embodiment, a portion of server rack 108 is disposed in each of zone 102, 104, and 104 of portable dehumidifying chamber 100. Front portion 118 of server rack 108 is disposed in zone 102, center portion 120 of server rack 108 is disposed in zone 104, and rear portion 122 of server rack 108 is disposed in zone 106. As previously discussed, vapor barrier 112 separates zone 102 and zone 104 but also separates front portion 118 and center portion 120 of server rack 108. Similarly, vapor barrier 114 separates zone 104 and zone 106 but also separates center portion 120 and rear portion 122 of server rack 108. As a result, air circulates in zone 102, 104, and 106, where air passes through a portion of zone 104. In this embodiment, the portion of zone 104 that experience recirculating air flow includes the interior area of server rack 108 and a remaining portion of zone 104 defined by the boundaries of the exterior walls of portable dehumidifying chamber 100, enclosure for server rack 108, vapor barrier 112, and 114, does not experience recirculating air flow. In other embodiments, the enclosure for sever rack 108 includes one or more integrated side vents, where recirculating air flow in the interior area of server rack 108 can exit into the remaining portion of zone 104 that does not experience recirculating air flow. Prior to utilizing portable dehumidifying chamber 100 to dehumidify the interior area of server rack 108, the one or more integrated side vent can be temporarily sealed to accelerate the air recirculation and dehumidification process.

Figure 2A:
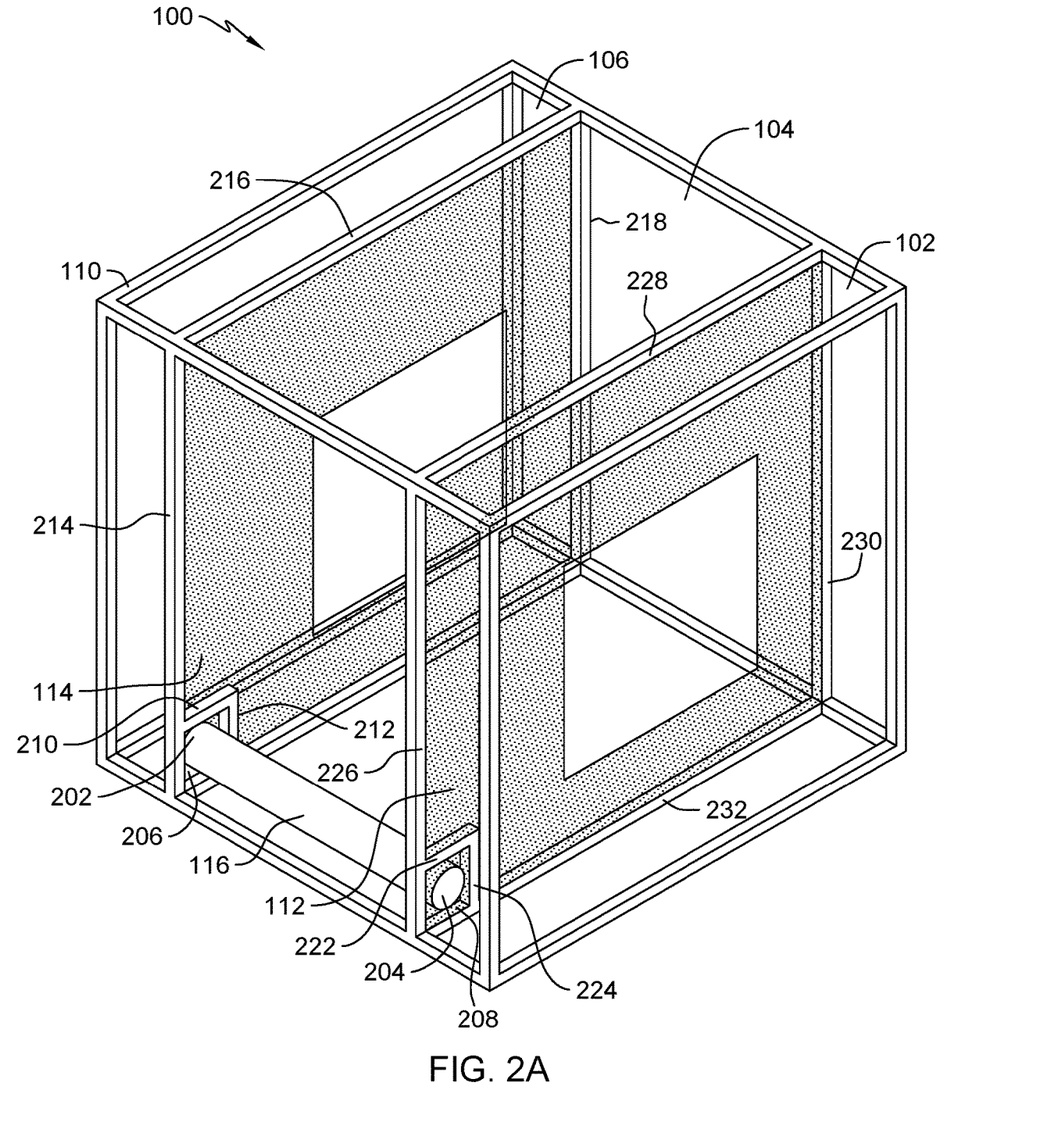
FIG. 2A depicts a 3-dimensional view of a portable dehumidifying chamber, in accordance with an embodiment of the present invention.

FIG. 2A depicts a 3-dimensional view of a portable dehumidifying chamber, in accordance with an embodiment of the present invention. Server rack 108 from FIGS. 1A and 1B is removed to illustrate an assembled portable dehumidifying chamber 100 without an object (i.e., server rack 108) requiring dehumidification disposed within. Conduit 116 includes inlet area 202 and outlet area 204, where humified air from 106 enters inlet area 202 and dehumidified air exits outlet area 204 into zone 102. Conduit 116 at inlet area 202 is supported by inlet structure 206, which represents a rigid panel coupled to a portion of frame 110 supporting vapor barrier 114. Conduit at outlet area 204 is supported by outlet structure 208, which represents a rigid panel coupled to a portion of frame 110 supporting vapor barrier 112. A first end of conduit 116 is coupled to inlet structure 206 and a second of conduit 116 is coupled to outlet structure 208. An outer perimeter of vapor barrier 114 is coupled to edge 210 and 212 of inlet structure 206, and portion 214, 216, 218, and 220 of frame 110. The outer perimeter of vapor barrier 114 is coupled in such a manner that a seal is created preventing air from leaking through. In some embodiment, portion 220 of frame 110 is not present and a corresponding portion of the outer perimeter of vapor barrier 114 is disposed on a stable surface (i.e., floor). An outer perimeter of vapor barrier 112 is coupled to edge 222 and 224 of outlet structure 208, and portion 226, 228, 230, and 232 of frame 110. Similar to vapor barrier 114, the outer perimeter of vapor barrier 112 is coupled in such a manner that a seal is created preventing air from leaking through. In some embodiment, portion 232 of frame 110 is not present and a corresponding portion of the outer perimeter of vapor barrier 112 is disposed on a stable surface (i.e., floor).

Figure 2B:
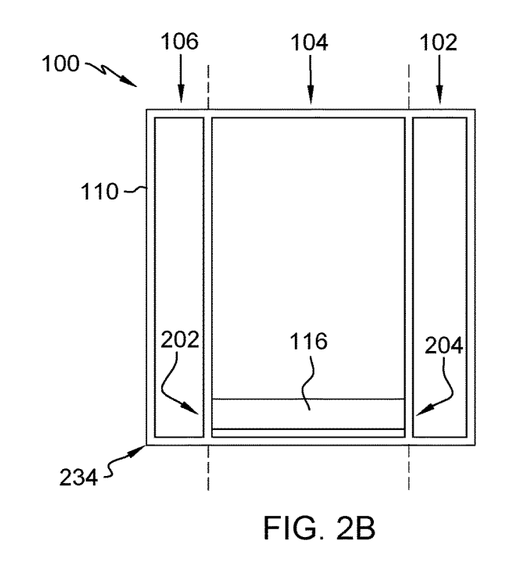
FIG. 2B depicts a side view of a portable dehumidifying chamber, in accordance with an embodiment of the present invention.

FIG. 2B depicts a side view of a portable dehumidifying chamber, in accordance with an embodiment of the present invention. Similar to FIG. 2A, server rack 108 from FIGS. 1A and 1B is removed to illustrate an assembled portable dehumidifying chamber 100 without an object (i.e., server rack 108) requiring dehumidification disposed within. Portion 234 of frame 110 is disposed on a stable surface, where the stable surface support an overall weight of portable dehumidifying chamber 100. As previously discussed, conduit 106 allows for air flow between zone 106 and 102, where humidified air enters at inlet area 202 and dehumidified air exits at outlet area 204. In this embodiment, conduit 116 is elevated above the stable surface on which portable dehumidifying chamber 100 is disposed, but in other embodiments conduit 116 can be disposed on the stable surface.

Figure 2C:
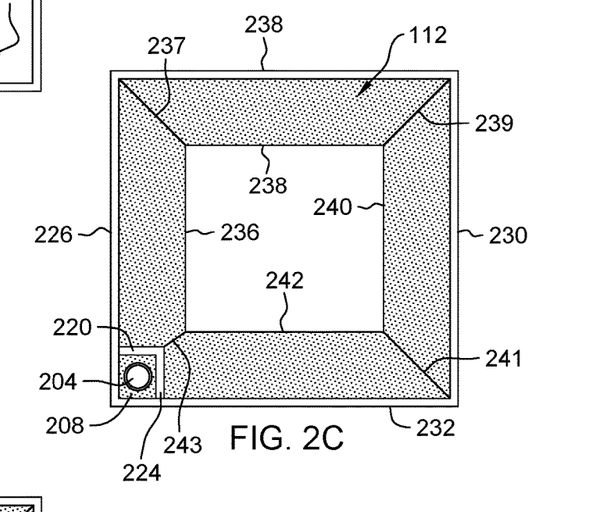
FIG. 2C depicts a front view of a portable dehumidifying chamber, in accordance with an embodiment of the present invention.

FIG. 2C depicts a front view of a portable dehumidifying chamber, in accordance with an embodiment of the present invention. Illustrated in the front view of portable dehumidifying chamber 100 is vapor barrier 112 with an adjustable inner perimeter for conforming to an object placed within portable dehumidifying chamber 100. As previously discussed, the outer perimeter of vapor barrier 112 is coupled to edge 222 and 224 of outlet structure 208, and portion 226, 228, 230, and 232 of frame 110. The outer perimeter of vapor barrier 112 is coupled in such a manner that a seal is created preventing air from leaking through. The inner perimeter of vapor barrier 112 is defined by edge 236, 238, 240, and 242, where a seal is created between the object in portable dehumidifying chamber 100 and edge 236, 238, 240, and 242. As a result, dehumidified air exiting outlet air area 204 is directed through area 244 defined by the inner perimeter of vapor barrier 112. Adjustable seams 237, 239, 241, and 243 allows for the inner perimeter of vapor barrier 112 to expand or contract to allow for each of edge 236, 238, 240, and 242 to conform to an exterior surface of the object place within portable dehumidifying chamber 100. Therefore, area 244 is adjustable depending on the dimensions of the objected placed within portable dehumidifying chamber 100. Adjustable seams 237, 239, 241, and 243 can utilize one or more securing mechanism including but not limited to hook-and-loop fasteners, buttons, zippers, stacked adhesive strips, and pin-in-hole fasteners.

Figure 2D:
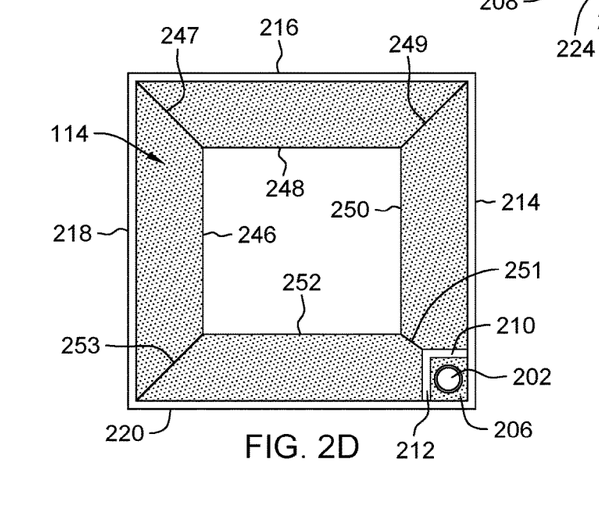
FIG. 2D depicts a rear view of a portable dehumidifying chamber, in accordance with an embodiment of the present invention.

FIG. 2D depicts a rear view of a portable dehumidifying chamber, in accordance with an embodiment of the present invention. Illustrated in the rear view of portable dehumidifying chamber 100 is vapor barrier 114 with an adjustable inner perimeter for conforming to an object placed within portable dehumidifying chamber 100. As previously discussed, the outer perimeter of vapor barrier 114 is coupled to edge 210 and 212 of inlet structure 206, and portion 214, 216, 218, and 220 of frame 110. The outer perimeter of vapor barrier 112 is coupled in such a manner that a seal is created preventing air from leaking through. The inner perimeter of vapor barrier 114 is defined by edge 246, 248, 250, and 254, where a seal is created between the object in portable dehumidifying chamber 100 and edge 246, 248, 250, and 254. As a result, area 254 defined by the inner perimeter of vapor barrier 112 directs humidified air to inlet air area 202. Adjustable seams 247, 249, 251, and 253 allows for the inner perimeter of vapor barrier 114 to expand or contract to allow for each of edge 246, 248, 250, and 252 to conform to an exterior surface of the object place within portable dehumidifying chamber 100. Therefore, area 254 is adjustable depending on the dimensions of the objected placed within portable dehumidifying chamber 100. Adjustable seams 247, 249, 251, and 253 can utilize one or more securing mechanism including but not limited to hook-and-loop fasteners, buttons, zippers, stacked adhesive strips, and pin-in-hole fasteners.

Figure 3A:
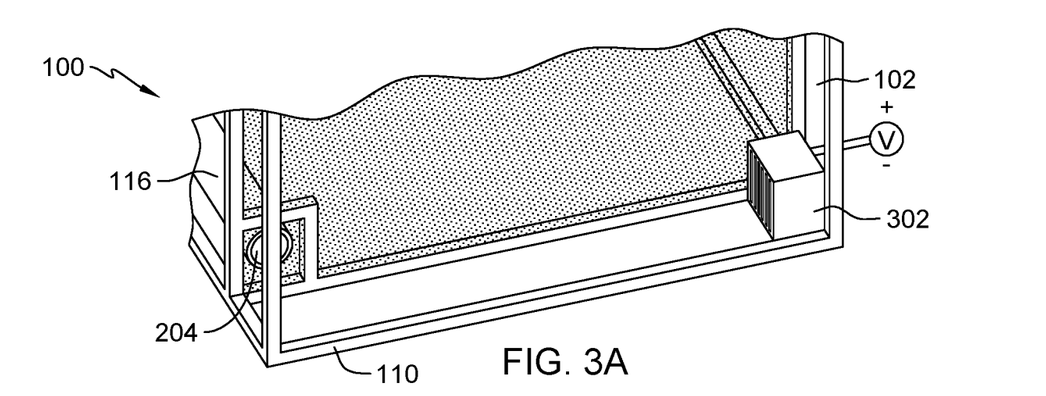
FIG. 3A depicts an electric heating unit in a heating zone of a portable dehumidifying chamber, in accordance with an embodiment of the present invention.

FIG. 3A depicts an electric heating unit in a heating zone of a portable dehumidifying chamber, in accordance with an embodiment of the present invention. In this embodiment, electric heater 302 is disposed in zone 102 of portable dehumidifying chamber 100, where electric heater 302 is integrated into frame 110 of portable dehumidifying chamber 100. Electric heater 302 utilizes an external power source independent from the object requiring dehumidification in portable dehumidifying chamber 100. As dehumidified air exits conduit 116 at outlet area 204, electric heater 302 heats the air causing warm airflow towards the object disposed in zone 104 of portable dehumidifying chamber 100. Conduit 116 can include an integrated fan for accelerating the dehumidified air through outlet area 204 into zone 102.

Figure 3B:
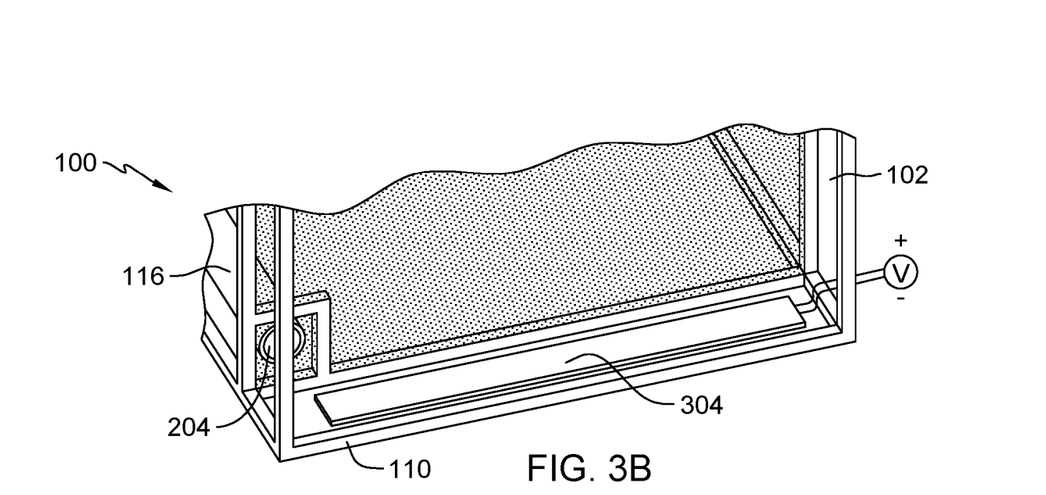
FIG. 3B depicts an electric heating pad in a heating zone of a portable dehumidifying chamber, in accordance with an embodiment of the present invention.

FIG. 3B depicts an electric heating pad in a heating zone of a portable dehumidifying chamber, in accordance with an embodiment of the present invention. In this embodiment, electric heating pad 304 is disposed in zone 102 of portable dehumidifying chamber 100, where electric heating pad 304 is integrated a floor panel of portable dehumidifying chamber 100. Electric heating pad 304 utilizes an external power source independent from the object requiring dehumidification in portable dehumidifying chamber 100. As dehumidified air exits conduit 116 at outlet area 204, electric heating pad 304 heats the air causing warm airflow towards the object disposed in zone 104 of portable dehumidifying chamber 100. Conduit 116 can include an integrated fan for accelerating the dehumidified air through outlet area 204 into zone 102. Depending on the application, one or more additional electric heating pads 304 can be integrated into one or more exterior walls of portable dehumidifying chamber 100 in zone 102.

Figure 3C:
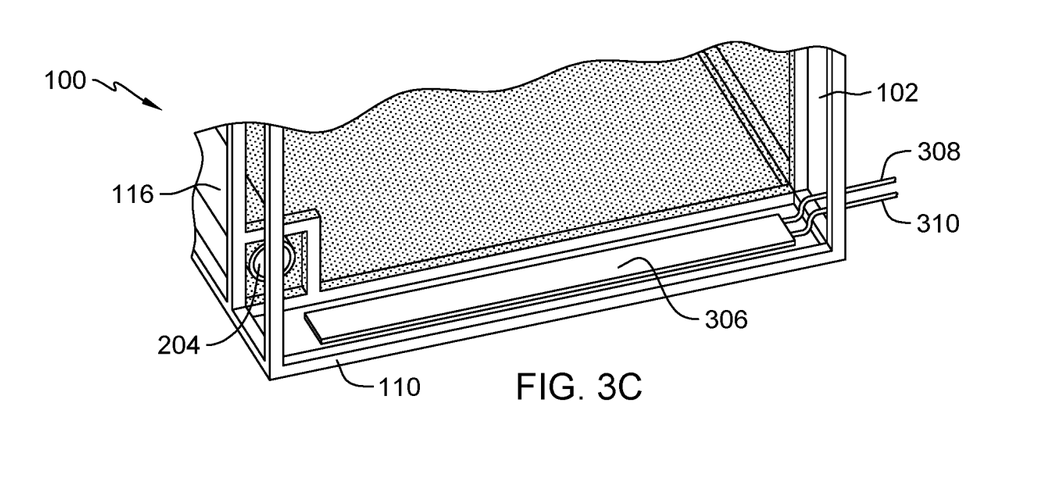
FIG. 3C depicts a water heating pad in a heating zone of a portable dehumidifying chamber, in accordance with an embodiment of the present invention.

FIG. 3C depicts a water heating pad in a heating zone of a portable dehumidifying chamber, in accordance with an embodiment of the present invention. In this embodiment, water heating pad 306 is disposed in zone 102 of portable dehumidifying chamber 100, where water heating pad 306 is integrated a floor panel of portable dehumidifying chamber 100. Water heating pad 304 utilizes an external heater water source independent to provide a heating effect to zone 102. Line 308 coupled to water heating pad 306 feeds heated water into water heating pad 306, while line 310 coupled to water heating pad 306 carries the heated water from water heating pad 306 (i.e., return line). Line 308 and 310 are coupled to external water heating device capable of heating and recirculating the water through water heating pad 304. As dehumidified air exits conduit 116 at outlet area 204, water heating pad 304 heats the air causing warm airflow towards the object disposed in zone 104 of portable dehumidifying chamber 100. Conduit 116 can include an integrated fan for accelerating the dehumidified air through outlet area 204 into zone 102. Depending on the application, one or more additional water heating pads 306 can be integrated into one or more exterior walls of portable dehumidifying chamber 100 in zone 102, where lines 308 and 310 for each of the one or more additional water heating pads 306 are coupled to the external water heating device.

Figure 4A:
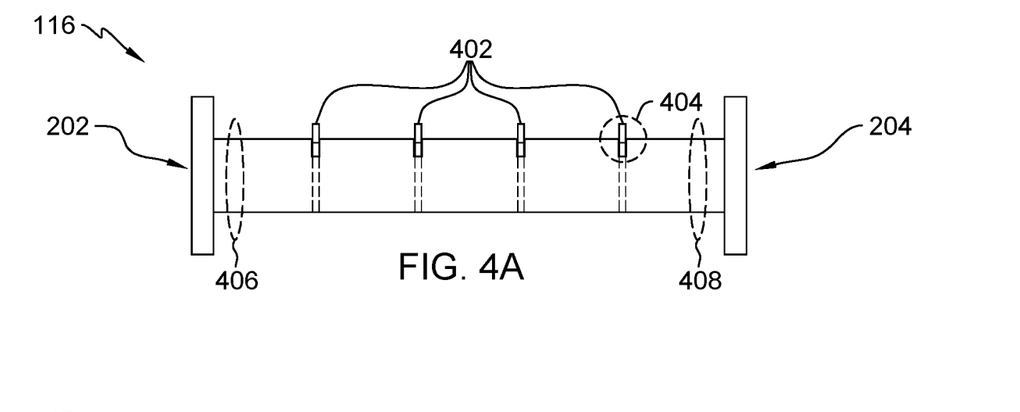
FIG. 4A depicts a side view of a conduit structure with a plenum that includes multiple desiccant discs, in accordance with an embodiment of the present invention.

FIG. 4A depicts a side view of a conduit structure with a plenum that includes multiple desiccant discs, in accordance with an embodiment of the present invention. In this embodiment, conduit 116 includes multiple desiccant discs 402 placed along a length of conduit 116, where each of desiccant disc 402 is positioned perpendicular to air flow. As humidified air enters at inlet area 202, moisture is drawn from the humidified air via the multiple desiccant discs 402, and the dehumidified air exists at outlet area 204. Each desiccant disc 402 is removable from conduit 116 and replaceable depending on whether a saturation point has been reach for a specific desiccant disc 402. A shape of each desiccant disc 402 (e.g., circular) matches a cross sectional shape of conduit 116, where a seal is created along a perimeter of each side of desiccant disc 402 and a perimeter of the cross section shape of conduit 116. Each desiccant disc 402 can include integrated handle 404 for assisting in removal and installation of each desiccant disc 402 into conduit 116. In other embodiments, each desiccant discs 402 is placed into a respective holder, where each holder is insertable into conduit 112 creating a seal along a perimeter of the cross sectional shape of conduit 116.

Area 406 near inlet area 402 includes a first humidity sensor and a first temperature sensor and area 408 near outlet area 204 includes a second humidity sensor and a second temperature sensor. The first and second temperature sensors are utilized to monitor and control an operating temperature of a heater (previously discussed in FIGS. 3A-3C) to avoid overheating sensitive equipment or materials in portable dehumidifying chamber 100 requiring dehumidification. The first and second humidity sensors measure ambient humidity levels and are utilized to determine whether a target humidity level is reached, signaling that the air recirculation and dehumidification process is complete. Area 408 can include a directional check valve to eliminate any reverse air flow into outlet area 204 of conduit 116. Furthermore, area 408 can include an integrated fan to create directional air flow towards outlet area 204 to eliminate any reverse airflow into outlet area 204 of conduit 116.

Figure 4B:
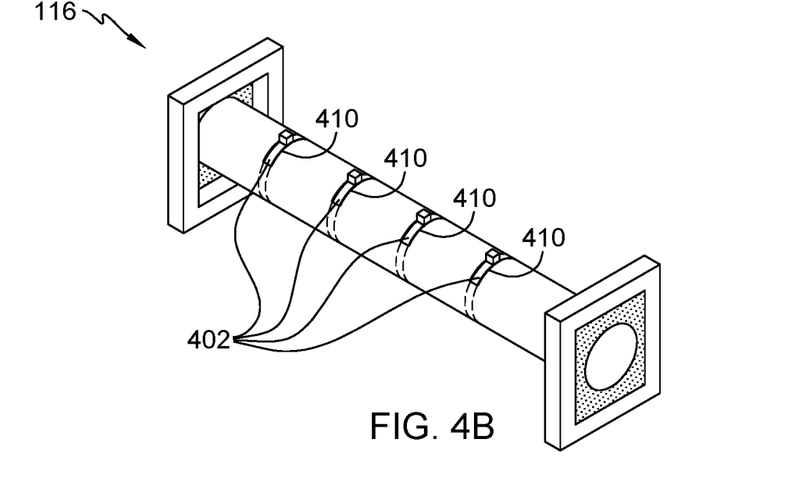
FIG. 4B depicts a 3-dimensional view of a conduit structure with a plenum that includes multiple desiccant discs, in accordance with an embodiment of the present invention.

FIG. 4B depicts a 3-dimensional view of a conduit structure with a plenum that includes multiple desiccant discs, in accordance with an embodiment of the present invention. As previously discussed, a shape of each desiccant disc 402 matches a cross sectional shape of conduit 116, where a seal is created along a perimeter of each side of desiccant disc 402 and a perimeter of the cross section shape of conduit 116. In this embodiment, each desiccant disc 402 is circular in shape to match a circular shape of conduit 116, where seal 410 on each side of each desiccant disc 402 prevents air flow from escaping between a perimeter of conduit 116 and a perimeter of desiccant disc 402. In other embodiments, where each desiccant disc 402 is places into a respective holder, seal 410 is created along a perimeter on each side of each holder of desiccant disc 402 disposed in conduit 116.

Figure 4C:
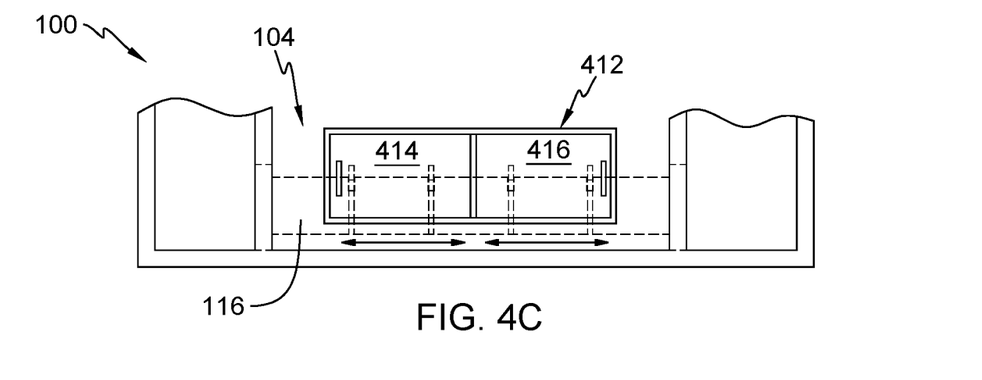
FIG. 4C depicts a side view of a portable dehumidifying chamber with an access door to the conduit structure from FIG. 4B, in accordance with an embodiment of the present invention.

FIG. 4C depicts a side view of a portable dehumidifying chamber with an access door to the conduit structure from FIG. 4B, in accordance with an embodiment of the present invention. In this embodiment, portable dehumidifying chamber 100 includes access panel 412 integrated into an exterior wall in zone 104 of portable dehumidifying chamber 100. Access panel 412 includes first sliding door 414 and second sliding door 416 to allow for access to the multiple desiccant discs 402 disposed in conduit 116 when at least one of first sliding door 414 and second sliding door 416 are in an open position. In a closed position, first sliding door 414 and second sliding door 416 create a seal preventing external air from being introduced into zone 104 of portable dehumidifying chamber 100. In other embodiments, access panel 412 utilizes a hinges panel door to gain access to the multiple desiccant discs 402 disposed in conduit 116.

Figure 4D:
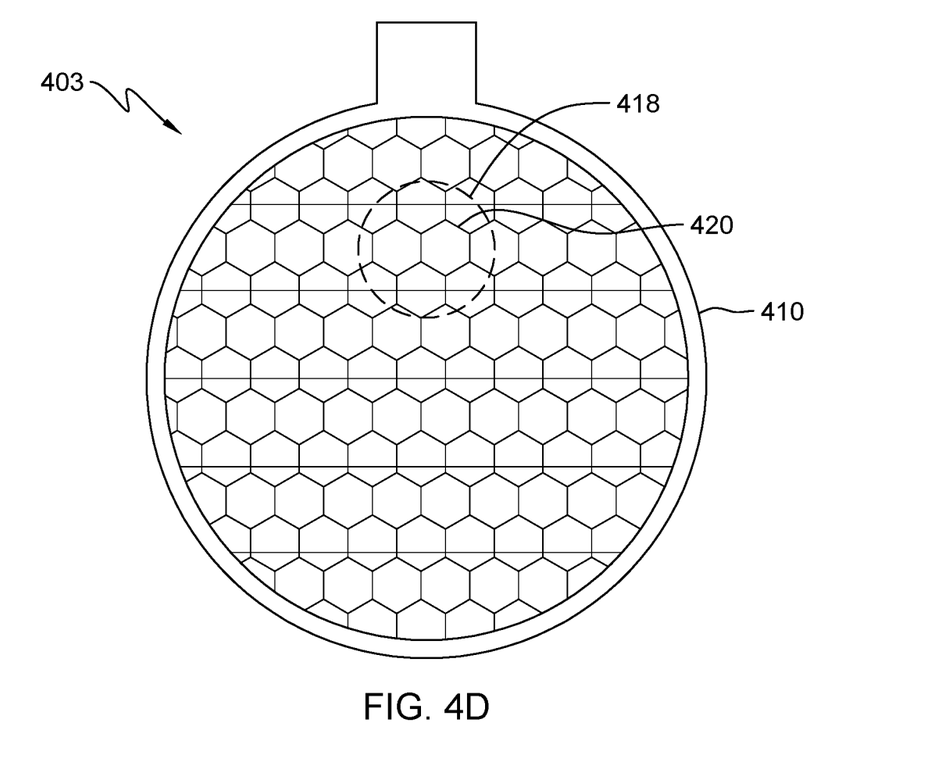
FIG. 4D depicts a single desiccant disc with a honeycomb pattern, in accordance with an embodiment of the present invention.

FIG. 4D depicts a single desiccant disc with a honeycomb pattern, in accordance with an embodiment of the present invention. Desiccant disc 402 includes honeycomb pattern 418, where desiccant material 420 comprises the structure for the honeycomb pattern 418. Desiccant material 420 represents a hygroscopic solid (e.g., silica gel) that induces or sustains a state of dryness (i.e., lower humidity) by absorbing moisture. Desiccant material 420 in desiccant disc 402 can include colored saturation indicators to show via a color change a degree of water-saturation of desiccant deices 402. The colored saturation indicators are utilized for indicating when desiccant disc 402 requires replacement with another desiccant disc 402 that has yet to absorb moisture. In some embodiments, conduit 116 is constructed out of a transparent material or includes a transparent viewing window, where a user servicing desiccant discs 402 can visually identify a color for each desiccant disc 402 disposed in conduit 116. Seal 410 on each side of each desiccant disc 402 prevents air flow from escaping between a perimeter of conduit 116 and a perimeter of desiccant disc 402.

Figure 5A:
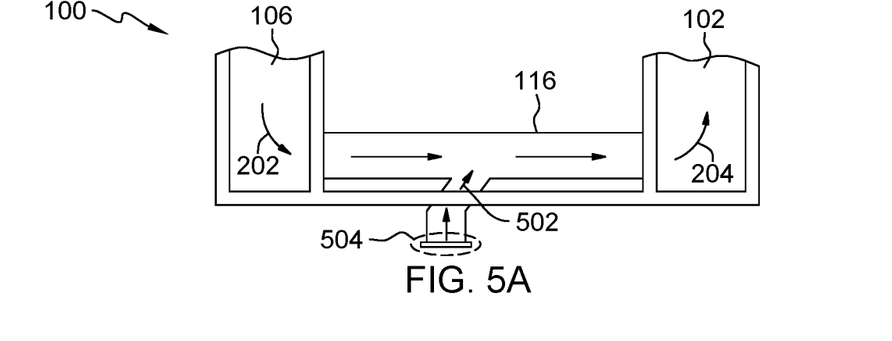
FIG. 5A depicts a top view of a conduit structure with a supplementary conduit structure, in accordance with an embodiment of the present invention.

FIG. 5A depicts a top view of a conduit structure with a supplementary conduit structure, in accordance with an embodiment of the present invention. In this embodiment, conduit 116 includes supplementary conduit 502, where a plenum of supplementary conduit 502 connects with a plenum of conduit 116. Supplementary conduit 502 includes connection point 504 extending from an exterior wall of portable dehumidifying chamber 100 for mechanically coupling to one or more dehumidification devices to assist with the air recirculation and dehumidification process. The one or more dehumidification devices can include but is not limited to an air conditioning unit, a dehumidifying unit, an electric fan, and a Heating, Ventilation, and Air Conditioning (HVAC) unit. The one or more dehumidification devices coupled at connection point 504 can work in conjunction with one or more desiccant discs in conduit 116 and/or supplementary conduit 502 (not illustrated in FIG. 5A). As humidified air enters conduit 116 at inlet area 202 from zone 106, supplementary conduit 502 provides additional airflow to conduit 116 to assist with dehumidifying the humidified air. The dehumidified air and the additional airflow provided from supplementary conduit 502 exits conduit 116 at outlet area 204 into zone 102.

Figure 5B:
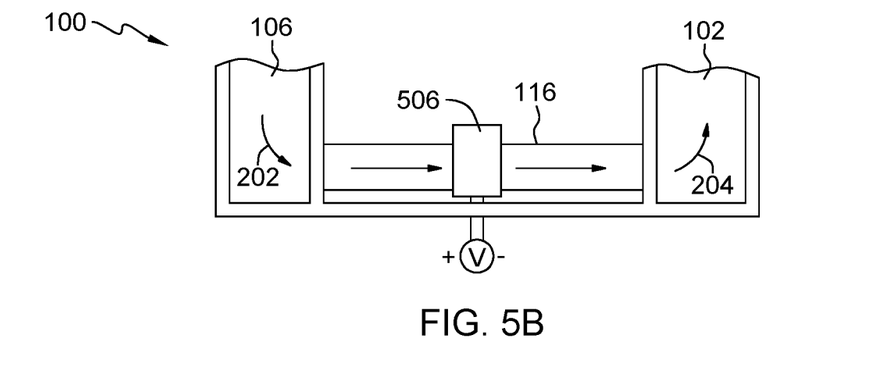
FIG. 5B depicts a top view of a conduit structure with an integrated dehumidifying device, in accordance with an embodiment of the present invention.

FIG. 5B depicts a top view of a conduit structure with an integrated dehumidifying device, in accordance with an embodiment of the present invention. In this embodiment, dehumidifying device 506 is coupled to conduit 116, where air flowing through conduit 116 is treated by dehumidifying device 506. Dehumidifying device 506 represents any device capable of dehumidifying air flow present within a plenum of conduit 116, such as an absorption/desiccant dehumidification device. Dehumidifying device 506 is electrical coupled to an external power source independent from a power source utilized by an object requiring dehumidification in portable dehumidifying chamber 100. As humidified air enters conduit 116 at inlet area 202 from zone 106, the humidified air flows in conduit 116 towards dehumidifying device 506. Dehumidifying device 506 accepts the humidified air, absorbs moisture present in the humidified air, and exhausts dehumidified air into conduit 116, where the dehumidified air exits conduit 116 at outlet area 204 into zone 102.

Figure 5C:
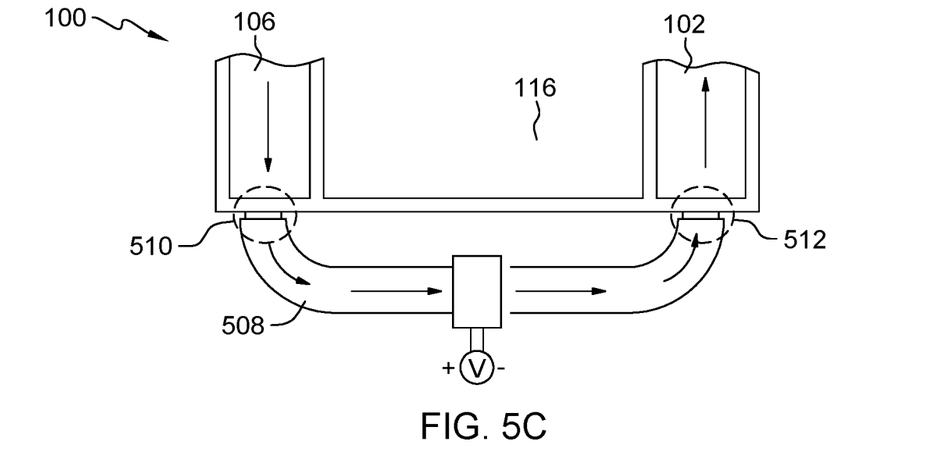
FIG. 5C depicts a top view of a conduit structure exterior to a portable dehumidifying structure with an integrated dehumidifying device, in accordance with an embodiment of the present invention.

FIG. 5C depicts a top view of a conduit structure exterior to a portable dehumidifying structure with an integrated dehumidifying device, in accordance with an embodiment of the present invention. In this embodiment, dehumidifying device 506 is coupled to external conduit 508, where air flowing through external conduit 508 is treated by dehumidifying device 506. Dehumidifying device 506 represents any device capable of dehumidifying air flow present within a plenum of external conduit 508, such as an absorption/desiccant dehumidification device. Dehumidifying device 506 is electrical coupled to an external power source independent from a power source utilized by an object requiring dehumidification in portable dehumidifying chamber 100. External conduit 508 is coupled to portable dehumidifying chamber 100 at connection point 510 and 512. As humidified air enters external conduit 508 at connection point 510 from zone 106, the humidified air flows in external conduit 508 towards dehumidifying device 506. Dehumidifying device 506 accepts the humidified air, absorbs moisture present in the humidified air, and exhausts dehumidified air into external conduit 508, where the dehumidified air exits external conduit 508 at connection point 512 into zone 102.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a modular cabling fixture (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for a portable dehumidifying chamber, the apparatus comprising:
a frame of a structure configured to include a first zone, a second zone, and a third zone, wherein a plurality of exterior walls coupled to the frame of the structure isolate the first zone, the second zone, and third zone from surrounding environmental conditions;
a heating device disposed in the first zone to facilitate heated air flow from the first zone to the third zone, wherein the heated air flow contacts an object disposed in the second zone to facilitate dehumidification of the object;
a conduit connecting the third zone to the first zone, wherein the conduit allows for humidified air flow to bypass the second zone, wherein the conduit includes a moisture removing apparatus;
a first vapor barrier material separates the first zone and the second zone; and
a second vapor barrier material separates the second zone and the third zone.

2. The apparatus of claim 1, wherein the first vapor barrier further comprises:
a first cavity for an outlet area portion of the conduit, wherein the outlet area portion of the conduit leads to the first zone; and
a second cavity conformable to an exterior surface of an object.

3. The apparatus of claim 2, wherein the second vapor barrier further comprises:
a first cavity for an inlet area portion of the conduit, wherein the inlet area portion of the conduit leads to the third zone; and
a second cavity conformable to the exterior surface of the object.

4. The apparatus of claim 3, wherein the moisture removing apparatus is one or more desiccant structures removable from the conduit.

5. The apparatus of claim 4, wherein each of the one or more desiccant structures comprises:
a honeycomb structure that includes a desiccant material configured to remove moisture from the humidified air flow.

6. The apparatus of claim 5, wherein each of the one or more desiccant structures is configured to change color based on a level of saturation.

7. The apparatus of claim 6, further comprising:
a fan disposed in the conduit for facilitating air flow from the inlet area portion of the conduit to the outlet area portion of the conduit.

8. The apparatus of claim 3, wherein the moisture removing apparatus is a dehumidification device electrically coupled to an external power source.

9. The apparatus of claim 1, further comprising:
the conduit connecting the third zone to the first zone disposed external to the frame of the structure, wherein an inlet area portion of the conduit is coupled to the third zone at a first connection point, wherein an outlet area portion of the conduit is coupled to the first zone at a second connection point; and
wherein the moisture removing apparatus is a dehumidification device electrically coupled to an external power source.

10. The apparatus of claim 3, further comprising:
an access panel integrated into a first exterior wall of the structure opposite the conduit, wherein the access panel is configured to allow for servicing of the moisture removing apparatus.

11. The apparatus of claim 3, wherein the heating device is electrically coupled to an external power source.

12. The apparatus of claim 11, wherein the heating device is an electrical heating pad.

13. The apparatus of claim 3, wherein the heating device is a water heating pad integrated into a lower surface of the structure, wherein a heated water feed line and a heated water return line are each coupled at a first end to the water heating pad and coupled at a second to a water heating device.

14. The apparatus of claim 3, wherein the conduit includes a check valve configured to prevent reverse air flow from the first zone into the outlet area portion of the conduit.

15. The apparatus of claim 3, further comprising:
one or more temperature sensors disposed in the conduit configured to control a running temperature of the heating device.

16. The apparatus of claim 3, further comprising:
one or more humidity sensors disposed in the conduit configured to control an air recirculation and dehumidification process.

17. The apparatus of claim 3, further comprising:
a first end of a supplementary conduit coupled to the conduit, wherein the supplementary conduit is configured to introduce additional air flow to the conduit.

* * * * *